US006424882B2

(12) United States Patent
Pierrat

(10) Patent No.: US 6,424,882 B2
(45) Date of Patent: Jul. 23, 2002

(54) METHOD FOR PATTERNING AND FABRICATING WORDLINES

(75) Inventor: Christophe Pierrat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/768,000

(22) Filed: Jan. 23, 2001

Related U.S. Application Data

(63) Continuation of application No. 09/004,522, filed on Jan. 8, 1998, now Pat. No. 6,185,473.

(51) Int. Cl.$^7$ ............................................. G06F 19/00
(52) U.S. Cl. ...................... 700/121; 700/108; 438/30; 438/158; 438/159; 438/598; 438/599; 438/248; 219/121.65; 219/212.66; 702/85
(58) Field of Search .................. 700/121, 108; 702/85; 438/30, 158, 159, 597, 248, 598, 320, 258, 290, 5, 291, 312, 296, 317, 262, 263; 219/121.65, 121.66

(56) References Cited

U.S. PATENT DOCUMENTS

| 4,231,811 A | * 11/1980 | Somekh et al. ............. 438/301 |
| 5,013,680 A | 5/1991 | Lowrey et al. ............... 437/52 |
| 5,065,273 A | 11/1991 | Rajeevakumar ............. 361/313 |

(List continued on next page.)

OTHER PUBLICATIONS

Law et al., A process for fabricating high current circuits with high interconnect density, 1994, IEEE, Page(s): 363–365 vol. 1.*
Beuret et al., Microfabrication of 3D multidirectional inclined structures by UV lithography and electroplating, 1994, IEEE, Page(s): 81–85.*
Inari, T., "A New Pattern Projection Method for Wide Range of Surface Roughness Measurement", *IEEE*, 0–7803–2775–6/96, 435–439, (1996).
Nomura, M., et al., "Velocity Measurement Using Phase Orthogonal Spatial Filters", *IEEE Transactions on Industry Applications, 32*, 796–801, (Jul. /Aug. 1996).
Poplavko, Y.M., et al., "Application of New Thermopiezoelectric Effect to Thermo–and Piezoelectret Records", *IEEE*, 0–7803–1939–Jul. 1994, 731–735, (1994).
Vela, G.D., et al., "Robust Adaptive Detetion of Optical Patterns in Low Resolution Airborne Radar Images", *IEEE*, 1429–1431, (1993).
Wolf, S., et al., *Silicon Processing for VLSI ERA, vol. 1: Process Technology*, Lattice Press, Sunset Beach California, 56–59; 189–191, (1990).

Primary Examiner—William A. Cuchlinski, Jr.
Assistant Examiner—McDieunel Marc
(74) *Attorney, Agent, or Firm*—Schwegman, Lundberg, Woessner & Kluth, P.A.

(57) ABSTRACT

The shape of chrome patterns on an optical pattern transfer tool are adjusted to get a desired shape on a wafer in the manufacture of semiconductor devices, wherein very small regions on a photoresist are defined and these regions are controlled with a high degree of accuracy. The optical pattern transfer tool has first and second planar surfaces lying in substantially parallel planes and a plurality of opaque regions overlying the first planar surface. First and second steps formed between and the first and second planar surfaces at first and second edges, respectively, define a width of the first planar surface. Each of the opaque regions are spaced from one another and offset from one another such that they are alternately aligned along a length of the first planar surface, such that one of the opaque regions is aligned with a portion of the first edge and the next one of the opaque regions along the length is aligned with a portion of the second edge. As a result of improving the process latitude of the wordline level in DRAMS, the size of the wordline over nonactive areas is reduced so that a maximum area is given for active areas for the bit contact and the container.

21 Claims, 12 Drawing Sheets

U.S. PATENT DOCUMENTS

| | | |
|---|---|---|
| 5,100,826 A | 3/1992 | Dennison |
| 5,234,856 A | 8/1993 | Gonzalez .................... 437/47 |
| 5,241,496 A | 8/1993 | Lowrey et al. ............... 365/96 |
| 5,244,759 A | 9/1993 | Pierrat ........................... 430/5 |
| 5,275,896 A | 1/1994 | Garofalo et al. ............... 430/5 |
| 5,308,721 A | 5/1994 | Garofalo et al. ............... 430/5 |
| 5,338,626 A | 8/1994 | Garofalo et al. ............... 430/5 |
| 5,582,939 A | 12/1996 | Pierrat ........................... 430/5 |
| 5,686,208 A | 11/1997 | Le et al. ........................ 430/5 |
| 5,718,829 A | 2/1998 | Pierrat ......................... 216/12 |
| 5,733,708 A * | 3/1998 | Catanzaro et al. .......... 430/296 |
| 5,851,704 A * | 12/1998 | Pierrat ........................... 430/5 |
| 5,876,878 A | 3/1999 | Pierrat et al. .................. 430/5 |
| 5,935,740 A * | 8/1999 | Pierrat ........................... 430/5 |
| 6,194,301 B1 * | 2/2001 | Radens et al. ............. 438/597 |
| 6,255,130 B1 * | 7/2001 | Kim ............................. 430/30 |

\* cited by examiner

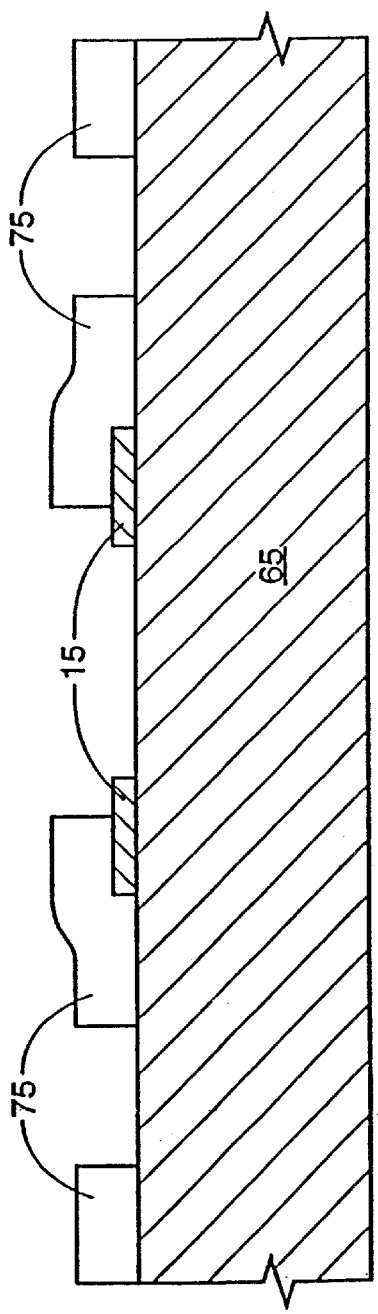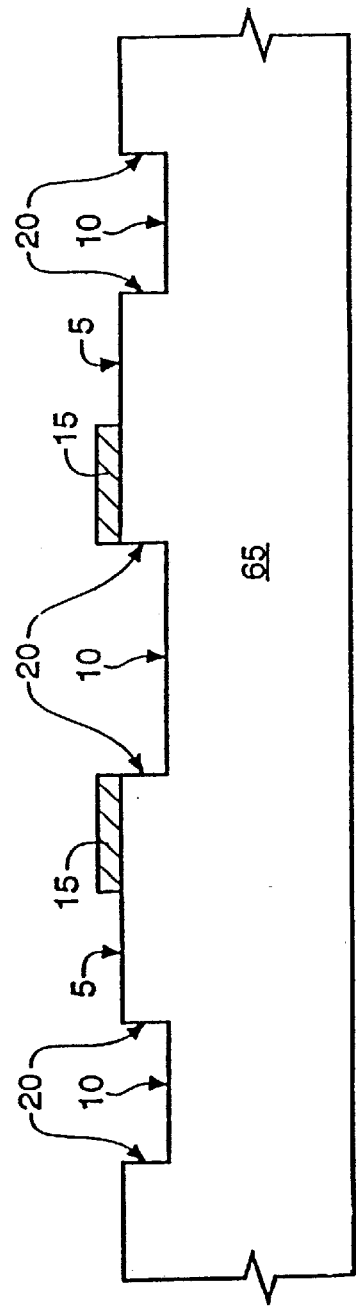

METHOD FOR PATTERNING AND FABRICATING WORDLINES

This application is a Continuation of U.S. application Ser. No. 09/004,522, filed Jan. 8, 1998 now U.S. Pat. No. 6,185,473 issued Feb. 6, 2001.

This invention was made with Government support under Contract No. MDA972-92-C-0054 awarded by Advance Research Projects Agency (ARPA). The Government has certain rights in this invention.

FIELD OF THE INVENTION

The invention relates to the fabrication of semiconductor devices, such as dynamic random access memory devices, and more particularly to patterning and fabrication of critical size tolerance structures, such as wordlines.

BACKGROUND OF THE INVENTION

In the fabrication of semiconductor integrated circuits optical pattern transfer tools are used to produce an optical pattern on photoresist which is a photosensitive material which is generally baked subsequent to its deposition on a semiconductor substrate structure. Light is directed at the optical pattern transfer tool. Transparent portions of the optical pattern transfer tool transmit the light to selected portions of the photoresist while opaque portions of the optical. pattern transfer tool prohibit the light from reaching the remaining portions of the photoresist.

When negative resist is used, photoresist not exposed to light is removed to expose portions of the substrate structure while the remaining resist protects unexposed portions of the substrate structure during subsequent processing steps. The opposite is true when positive resist is used. In this case the photo resist exposed to the light is removed. During a development step the portions to be removed are usually rendered soluble in a base solution and rinsed from the semiconductor substrate structure in de-ionized (DI) water. Remaining resist may then be hardened by re-baking to ensure adhesion of the resist to the semiconductor substrate structure.

There are different optical configurations available to expose the optical pattern transfer tool. It should be noted that presently there are "two sizes" of optical pattern transfer tools, a mask and a reticle. The mask is used to pattern an entire semiconductor wafer in one exposure step. In this case the pattern for the entire wafer is represented on the optical pattern transfer tool. The reticle represents a pattern for only a portion of the entire wafer and is stepped across the wafer during exposure to light in order to pattern the entire wafer.

There are at least two important criteria of an optical pattern transfer tool which concern the engineer. First the engineer wants to be able to determine an exact size, within tolerances, of a feature having a critical dimension. Second the engineer wants to be able to define an area having a smallest width possible without being concerned with its exact dimension.

One present optical pattern transfer tool comprises two types of materials, one which transmits light, such as quartz, and one which prohibits the transfer of light, such as chrome. Using methods presently available it is possible to create a chrome region having a critical dimension falling within specified tolerances. Thus, there is a minimum width the chrome can be and still have its exact size fall within the critical dimension specification. However, using this "two material" optical pattern transfer tool does not allow definition of very small regions on the photoresist due to the limitations of photolithography.

A "one material" optical pattern transfer tool comprises a transparent material having two surfaces, where each surface lies in a plane which is parallel to a plane of the other surface. Between the planes "steps" are formed. Each step is formed where the material transitions from one planar surface to the other planar surface. Optical transfer of light is substantially prohibited at the step. This results in very small areas of the photoresist not. being exposed to light, which allows definition of very small regions on the photoresist. However, using the "one material" optical pattern transfer tool does not allow dimensions to be controlled with a high degree of accuracy.

Furthermore, memory density is typically limited by a minimum lithographic feature size (F) that is imposed by lithographic processes used during fabrication. For example, the present generation of high density dynamic random access memories (DRAMs), which are capable of storing 256 Megabits of data, require an area of $8F^2$ per bit of data. There is a need in the art to maximize active areas on a memory device as compared to field areas in order to support increased storage capacity.

Accordingly, wordlines in these higher density memory devices require minimal width and must be accurately defined to stay within critical dimensions. When small dimensions are defined on a DRAM and critical dimensions are controlled, increased memory density is supported. Therefore, there is a need for an optical transfer tool in the manufacture of semiconductor devices wherein very small regions on a photoresist can be defined and these regions can be controlled with a high degree of accuracy.

SUMMARY OF THE INVENTION

In an exemplary embodiment the invention includes a method for forming a wordline wherein light is projected onto an optical pattern transfer tool comprised of an opaque material and a transparent material having first and second thicknesses. A sidewall of the opaque material is aligned with only a portion of a sidewall of the transparent material at a transition between the first and second thicknesses of the transparent material. The optical transfer pattern tool substantially prohibits light from passing through the opaque material and the transition of the transparent material at the portion aligned With the sidewall of the opaque material to pattern a wordline on a photoresist layer overlying an active area.

In another embodiment of the invention, a computer system comprises a memory device, the memory device including an array of memory cells, each memory cell including a transistor, a capacitor, a bit contact, and addressing circuitry coupled to the array of memory cells via wordlines for accessing individual memory cells in the array of memory cells, and a read circuit coupled to the array of memory cells via bitlines for reading individual memory cells in the array of memory cells, wherein a width of the wordline is 0.15 micrometers and the distance between two adjacent wordlines is 0.2 micrometers.

In a further embodiment of the invention, a dynamic random access memory (DRAM) device comprises an array of memory cells, each memory cell including a transistor, a capacitor, a bit contact, and addressing circuitry coupled to the array of memory cells via wordlines for accessing individual memory cells in the array of memory cells, and a read circuit coupled to the array of memory cells via bitlines for reading individual memory cells in the array of memory cells, wherein a width of the wordline is 0.15 micrometers and the distance between two adjacent wordlines is 0.2 micrometers.

By using the method of the invention the shape of the chrome patterns on the optical pattern transfer tool are adjusted to get a desired shape on the wafer. For nonactive areas on a DRAM, the width of a wordline is printed as small as 0.15 micrometers and the separation between these wordlines in the nonactive areas is as small as 0.2 micrometers at 365 nanometer lithography.

BRIEF DESCRIPTION OF THE DRAWINGS

FIGS. 7–12 depict cross-sectionally a process for fabricating the optical pattern transfer tool shown in FIG. 4A–C.

DETAILED DESCRIPTION OF THE PREFERRED EMBODIMENTS

Figure 1:
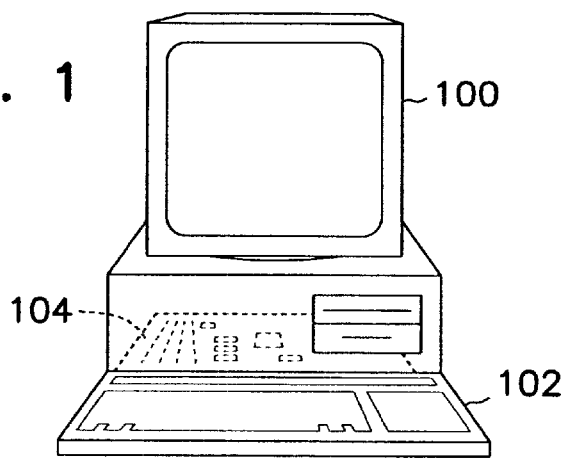
FIG. 1 illustrates a personal computer of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
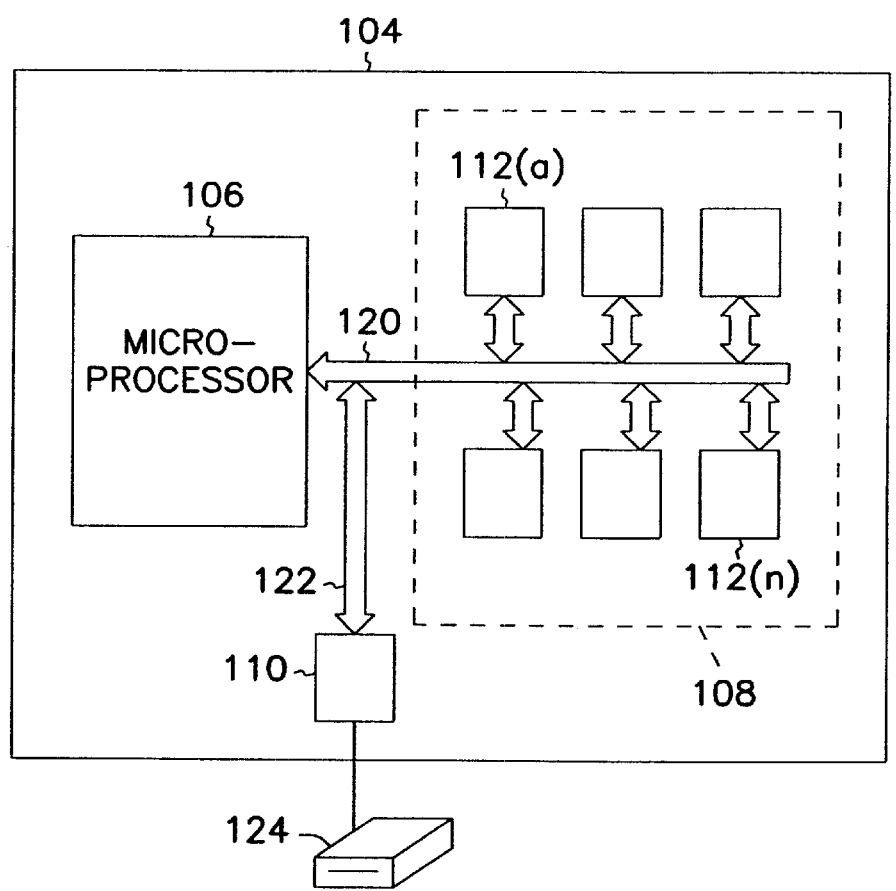
FIG. 2 illustrates a block diagram of an interface for a microprocessor and a memory device of FIG. 1.

A personal computer, as shown in FIGS. 1 and 2, include a monitor 100, keyboard input 102 and a central processing unit 104. The processor unit typically includes microprocessor 106, memory bus circuit 108 having a plurality of memory slots 112(a–n), and other peripheral circuitry 110. Peripheral circuitry 110 permits various peripheral devices 124 to interface processor-memory bus 120 over input/output (I/O) bus 122.

Microprocessor 106 produces control and address signals to control the exchange of data between memory bus circuit 108 and microprocessor 106 and between memory bus circuit 108 and peripheral circuitry 110. This exchange of data is accomplished over high speed memory bus 120 and over high speed I/O bus 122.

Coupled to memory bus 120 are a plurality of memory slots 112(a–n) which receive memory devices well known to those skilled in the art. For example, single in-line memory modules (SIMMs) and dual in-line memory modules (DIMMs) may be used in the implementation of the present invention. Each type of integrated memory device has an associated communications speed which in turn limits the speed data can be read out of or written into memory bus circuit 108.

These memory devices can be produced in a variety of designs which provide different methods of reading from and writing to the dynamic memory cells of memory slots 112. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 108. A typical communication speed using page mode a DRAM device is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 120. Other alternative types of devices include SDRAM, DDR SDRAM, SLDRAM and Direct RDRAM as well as others such as SRAM or Flash memories.

Figure 3:
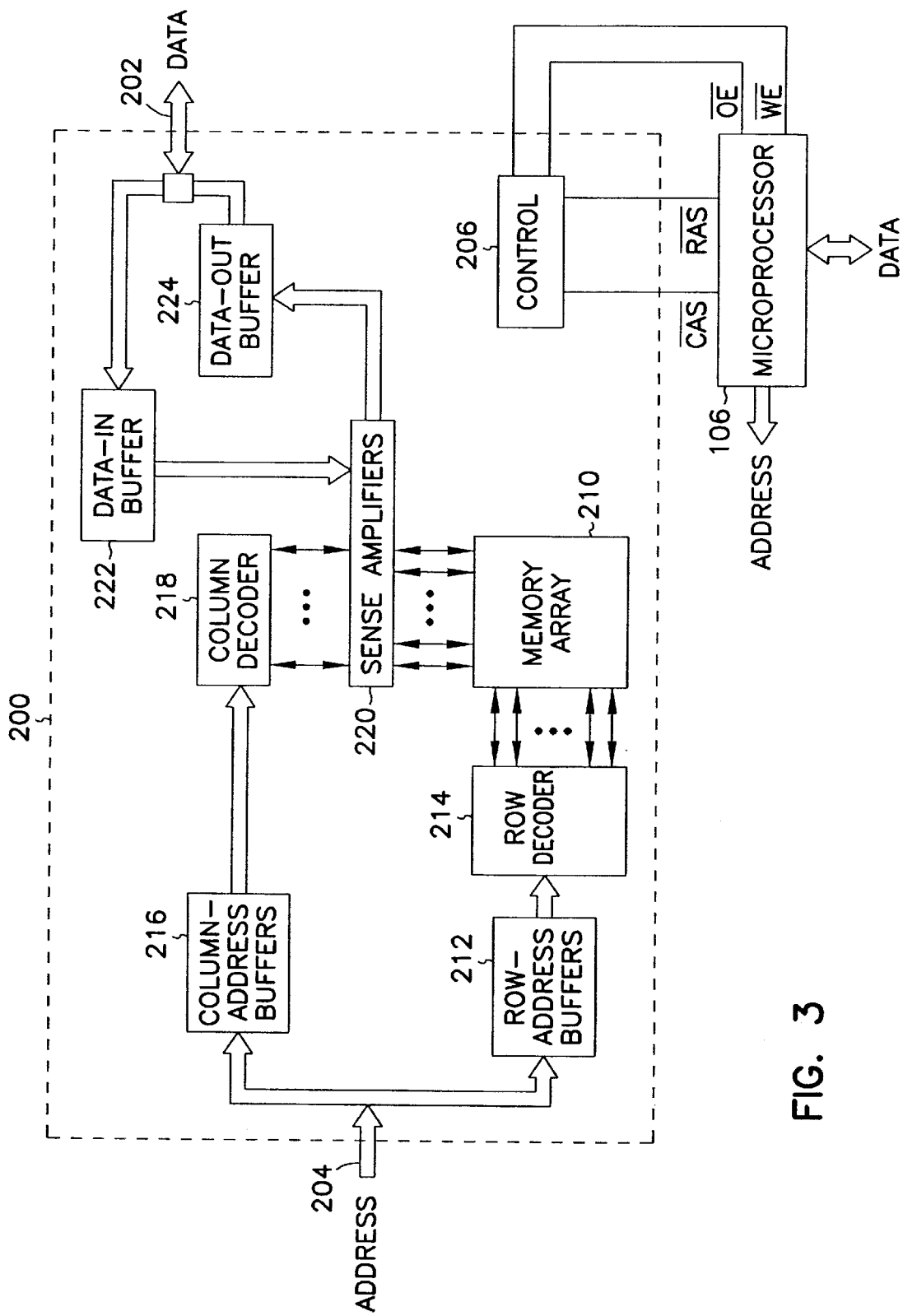
FIG. 3 is a block diagram of a DRAM memory device.

FIG. 3 is a block diagram of an illustrative DRAM device 200 compatible with memory slots 112(a–n). The description of DRAM 200 has been simplified for purposes of illustrating a DRAM memory device and is not intended to be a complete description of all the features of a DRAM. Those skilled in the art will recognize that a wide variety of memory devices may be used in the implementation of the present invention.

Control, address and data information provided over memory bus 120 is further represented by individual inputs to DRAM 200, as shown in FIG. 3. These individual representations are illustrated by data lines 202, address lines 204 and various discrete lines directed to control logic 206.

As is well known in the art, DRAM 200 includes memory array 210 which in turn comprises rows and columns of addressable memory cells. Each memory cell in a row is coupled to a common wordline. Additionally, each memory cell in a column is coupled to a common bitline. Each cell in memory array 210 includes a storage capacitor and an access transistor as is conventional in the art.

DRAM 200 interfaces with, for example, microprocessor 106 through address lines 204 and data lines 202.

Alternatively, DRAM 200 may interface with a DRAM controller, a micro-controller, a chip set or other electronic system. Microprocessor 106 also provides a number of control signals to DRAM 200, including but not limited to, row and column address strobe signals RAS* and CAS*, write enable signal WE*, an output enable signal OE* and other conventional control signals.

The illustrative embodiments described herein concern electrical circuitry which uses voltage levels to represent binary logic states-namely, a "high" logic level and a "low" logic level. Further, electronic signals used by the various embodiments of the present invention are generally considered active when they are high. However, an asterisk (*) following the signal name in this application indicates that the signal is negative or inverse logic. Negative or inverse logic-is considered active when the signal is low.

Row address buffer 212 and row decoder 214 receive and decode row addresses from row address signals provided on address lines 204 by microprocessor 106. Each unique row address corresponds to a row of cells in memory array 210. Row decoder 214 includes a wordline driver, an address. decoder tree, and circuitry which translates a given row address received from row address buffers 212 and selectively activates-the appropriate wordline of memory array 210 via the wordline drivers.

Column address buffer 216 and column decoder 218 receive and decode column address signals provided on address lines 204. Column decoder 218 also determines when a column is defective and the address of a replacement column. Column decoder 218 is coupled to sense amplifiers 220. Sense amplifiers 220 are coupled to complementary pairs of bitlines of memory array 210.

Sense amplifiers 220 are coupled to data-in buffer 222 and data-out buffer 224. Data-in buffers 222 and data-out buffers 224 are coupled to data lines 202. During a write operation, data lines 202 provide data to data-in buffer 222. Sense amplifier 220 receives data from data-in buffer 222 and stores the data in memory array 210 as a charge on a capacitor of a cell at an address specified on address lines 204.

During a read operation, DRAM 200 transfers data to microprocessor 106 from memory array 210. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 220 detects and amplifies a difference in voltage between the complementary bitlines. The sense amplifier passes the amplified voltage to data-out buffer 224.

Control logic 206 is used to control the many available functions of DRAM 200. In addition, various control circuits and signals not detailed herein initiate and synchronize DRAM 200 operation as known to those skilled in the art. As stated above, the description of DRAM 200 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Memory density is typically limited by the minimum lithographic feature size (F) imposed by a lithographic processes used during fabrication of such devices. The present generation of DRAMs 200 require an area of $8F^2$ per bit of data. In order to provide higher density memories, a feature size must be made as small as possible. For example, a feature includes the width of a wordline must be made as small as possible, particular in nonactive active areas on a memory device in order to provide higher density memories. The term "nonactive" is interchangeable with "field," wherein field is the insulation portion of the semiconductor integrated circuit. Another method for providing higher density memories is with respect to critical dimensions, e.g., spacing between adjacent wordlines in nonactive areas, must be small as possible. If the dimension are reduced in the nonactive areas, then more space is available in the active areas. Critical dimensions must be accurately controlled to insure predicable reliability in the manufacture and operation of memory devices, such as DRAMs 200.

Figure 4A:
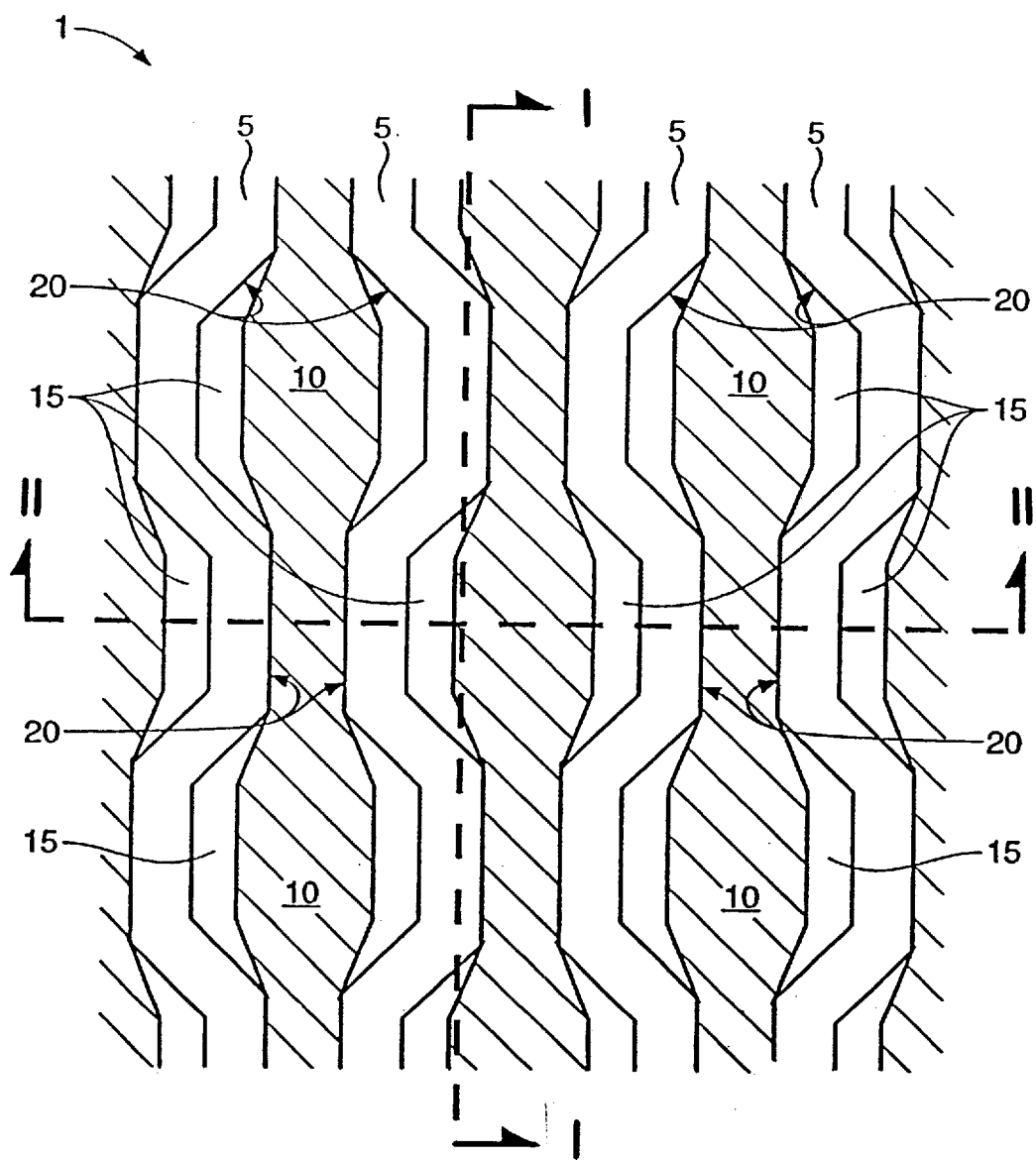
FIG. 4A is a top planar view of an optical pattern transfer tool.
Figure 4B:
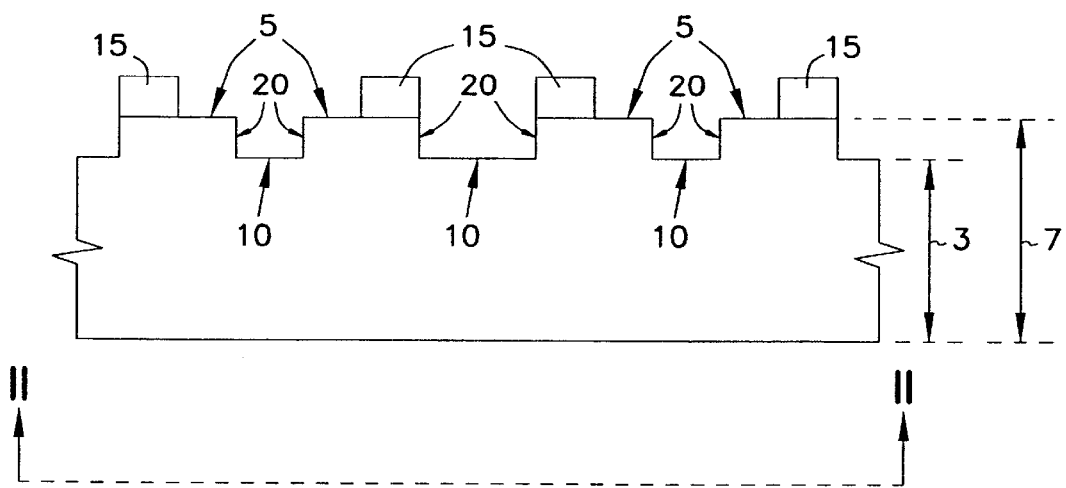
FIG. 4B is a cross section of the optical pattern transfer tool of FIG. 1A taken at the R axis.
Figure 4C:
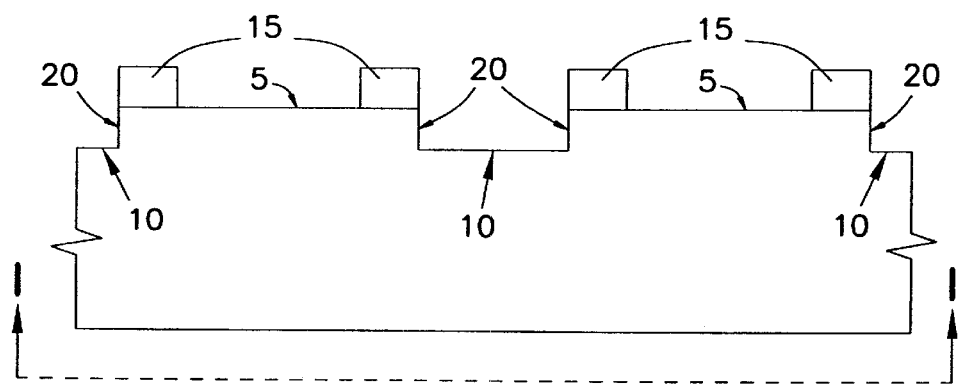
FIG. 4C is a cross section of the optical pattern transfer tool of FIG. 1A taken at the S axis.

As shown in FIGS. 4A–C, one preferred embodiment of the invention includes a method for forming wordlines on DRAM 200, wherein light is projected onto an optical pattern transfer tool 1 comprised of opaque material 15 and a transparent material having first 7 and second 3 thicknesses. The transparent material has at least two planar surfaces 5, 10 lying in parallel planes. "Step" 20 is formed between the two parallel surfaces 5, 10 and a planar surface formed in a plane which is substantially perpendicular to the planes in which the two parallel surfaces lie. Each step 20 is formed where the transparent material transitions between the two parallel planes 5, 10. The intensity of the light or other energy source transmitted through the transparent material is decreased at step 20 allowing a very small dimension to be defined by the optical pattern transfer tool 1. The exact dimension of the feature defined by step 20 is difficult to predetermine because it is a function of optical parameters, including numerical aperture and partial coherence, and photomask parameters, including sidewall angle of the phase transition. The step is fabricated in order that the light transmitted on either side of step 20 is approximately 180 degrees out of phase, preferably 180 degrees plus or minus 10 degrees.

Thus, there is substantially no light transmitted at step 20 itself. The engineer can determine the depth of step 20 from the wavelength of the light and the refractive index of the transparent material according to the formula $d=\lambda/2(n-1)$, where $\lambda$ equals wavelength and n equals the refractive index.

When forming optical pattern transfer tool 1, the dimension of the opaque material, preferably chrome, is predetermined and tightly controlled. Thus, a critical dimension of a feature on DRAM 200, such as a wordline, fabricated using optical pattern transfer tool 1 is controllable. By using optical pattern transfer tool 1, wordlines are fabricated with portions having very small dimensions and portions in which the critical dimensions are tightly controlled.

FIG. 4A is a top planar view of an exemplary optical pattern transfer tool 1 of the invention. A transparent material, such as quartz, comprises regions 5 and 10 having parallel planar surfaces. The following is a list of other transparent materials which may also be used in place of quartz: green soda-lime glass, low sodium white soda-lime glass, borosilicate glass, and aluminum oxide. The optical pattern transfer tool 1 is oriented such that if it were being used during wafer fabrication light would be exposing it from below.

A cross section taken at the R axis in FIG. 4A is shown in FIG. 4B, and a cross section taken at the S axis in FIG. 4A is shown in FIG. 4C. An opaque material, such as a chromium, oxygen and nitrogen mixture, referred to as chrome 15, underlies portions of the glass 5, see FIGS. 4A–C. Chrome 15 defines the critical widths of features of a semiconductor integrated circuit. One such critical width is the width of a wordline overlying an active region, as illustrated in FIG. 5 by d1 for active regions 40 on DRAM 200 and by d3 for nonactive regions 50.

The location of two chrome regions 15 also defines the width of the: transparent material 10 lying between the two chrome regions 15. The width of this region 10 lying between two chrome regions 15 is also critical and must fall within specification guidelines. Steps 20 can be readily seen in FIGS. 4B and 4C. In FIG. 4A, steps 20 are formed at the boundaries between regions 5 and 10.

Figure 5:
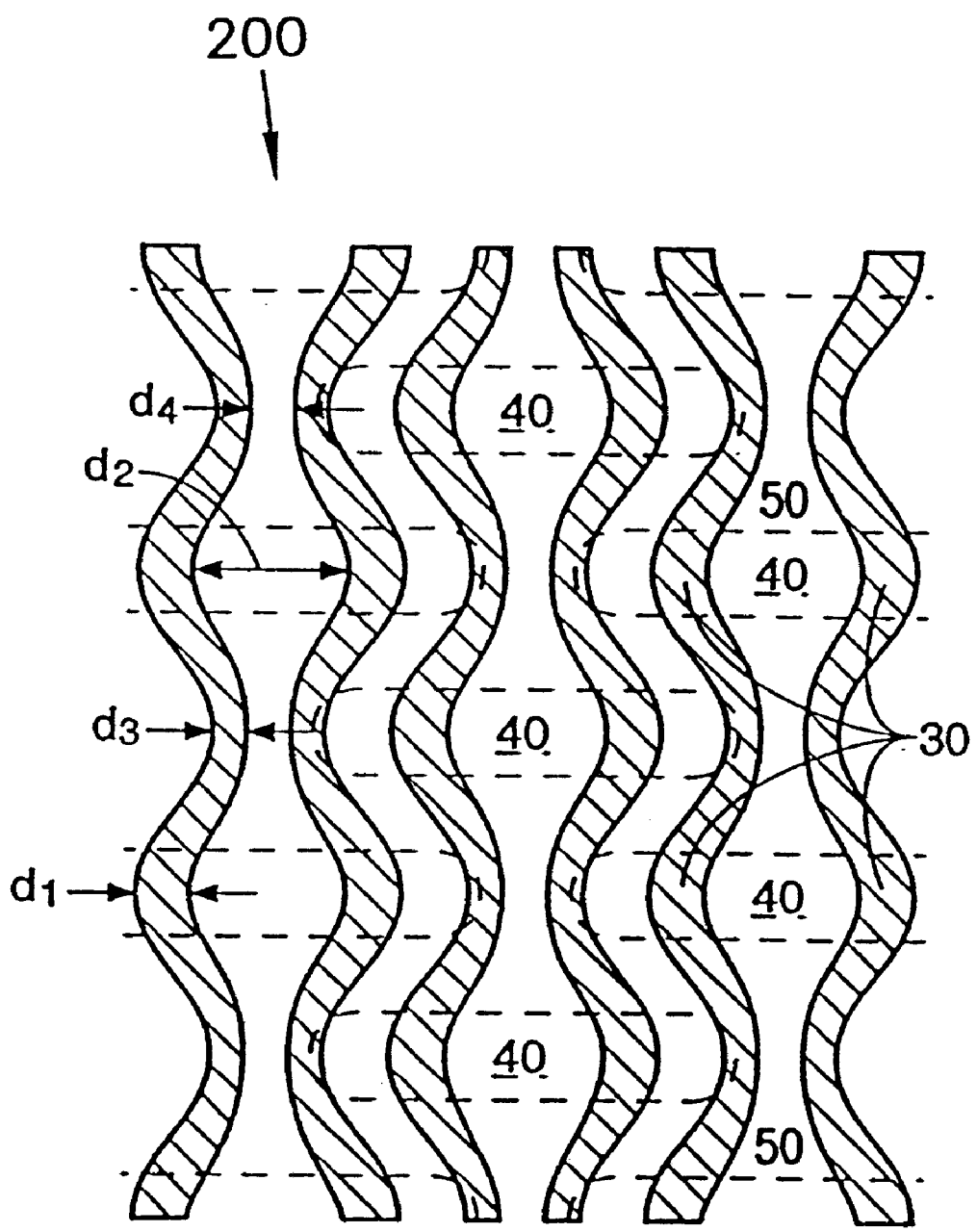
FIG. 5 is a top planar view of a partially fabricated DRAM and wordlines fabricated thereon.
Figure 6:
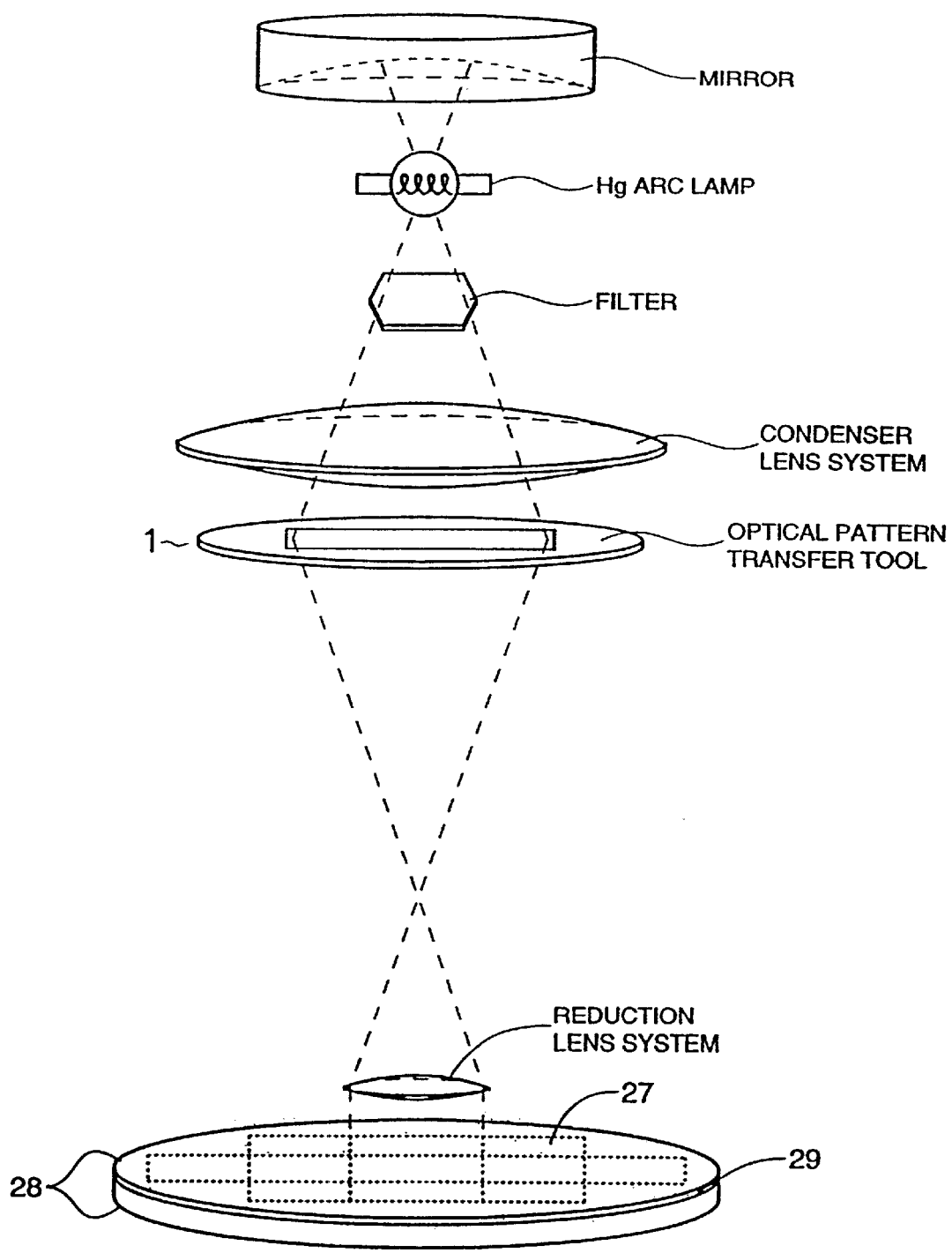
FIG. 6 depicts a process step for patterning photoresist.

FIG. 5 depicts a partially fabricated DRAM 200 made using the method of the invention to form wordlines 30. FIG. 5 is a simplified depiction of the wordline patterning process step. Ultra violet (UV) light is directed through optical pattern transfer tool 1, of FIGS. 4A–C, onto a photoresist layer 27 overlying a conductive layer 29 which overlies a substrate structure 28.

In reference to FIG. 5, the substrate structure comprises patterned layers forming field areas 50 and active areas 40 each containing two access transistors, two container cell capacitors, and a bit contact. The photoresist layer 27 is positive. The light renders exposed portions of the photoresist soluble, and it is developed with a base solution, and rinsed from the wafer using DI water. Exposed portions of the conductive layer 29 are then etched. The conductive layer 29 remaining after the etch forms the wordlines 30 of DRAM 200. Preferably the conductive layer 29 is a polysilicon layer underlying a tungsten silicide layer. It is also possible to use a negative photoresist when implementing the method of the invention.

Width d1 of wordlines 30 overlying each active area 40 and width d2 of the distance between the wordlines in the active area 40 have critical dimensions defined by engineering specifications. A plug is fabricated in active area 40 defined by d2. The chrome regions 15 of optical pattern transfer tool 1 are fabricated according to these critical dimensions. The dimensions of d1 is defined by chrome regions 15, as shown in FIGS. 4A–C. Dimension d2 is defined by the distance between two chrome regions 15 and is precisely determined by positioning of these chrome regions 15.

As wordlines 30 progress along the semiconductor to overly the nonactive field areas 50 their widths, d3, and the distance between them, d4, decrease, thereby allowing the accommodation of an active area on adjoining pairs of wordlines using minimal space. Dimensions d3 and d4 can be patterned as small as 0.15 and 0.2 micrometers respectively using 365 nanometer lithography in conjunction with optical pattern transfer tool 1.

Steps 20 of optical pattern transfer tool 1 allow width d3 of wordlines 30 and distance d4 between wordlines 30 to decrease, thereby allowing width d3 to be very small over the nonactive field areas. Decreasing wordline width d3 and distance d4 between wordlines 30 in nonactive field areas 50 allows the density of active devices on DRAM 200 to increase. Chrome pattern 15 can be adjusted to get a desired shape of wordlines 30 or other features on the wafer. Thus, the method of the invention provides for the fabrication of features having small widths and widths having critical dimensions.

A method for making optical pattern transfer tool 1 which produces DRAM 200 having desired wordline widths and spacings, as shown in FIGS. 4A–C and 5, is shown pictorially in cross sections of FIGS. 7–12.

Figure 7:
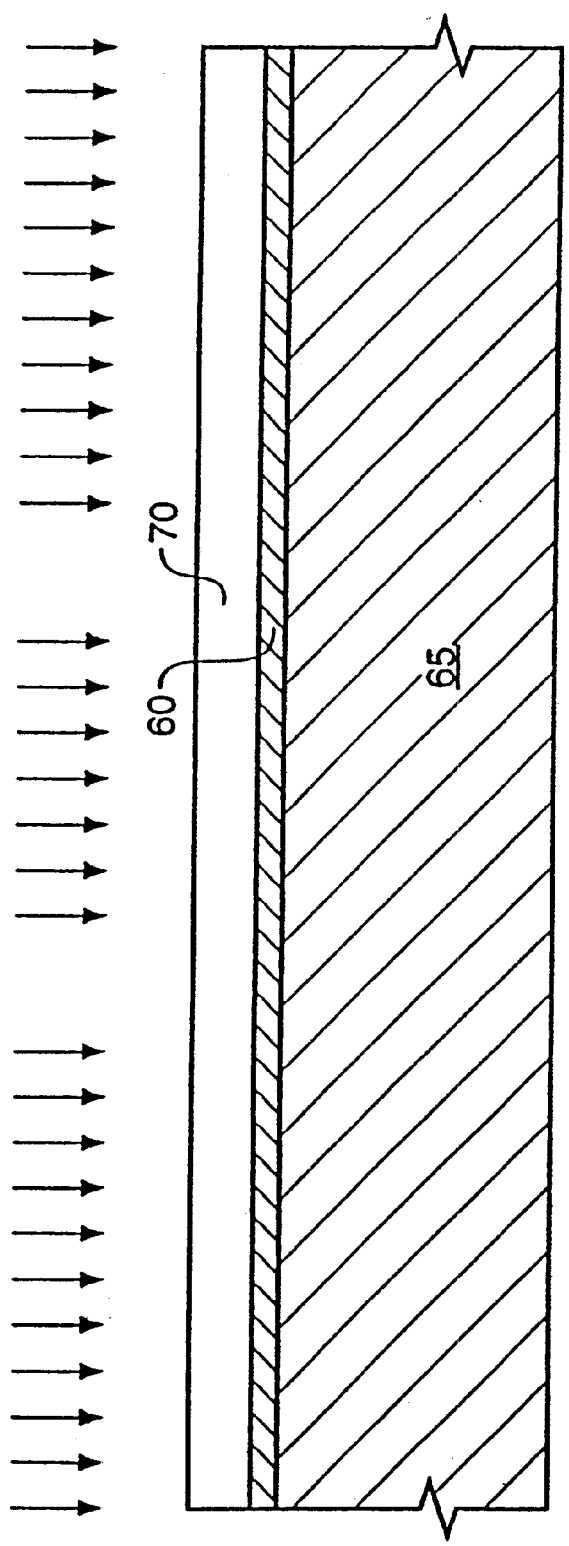

In FIG. 7, an opaque layer, preferably a chromium, oxygen, and nitrogen mixture, referred to as chrome 60, having a thickness of between 500 and 2000 Angstroms, preferably 1000 Angstroms, has been deposited, preferably sputter deposited or evaporated to overlie a layer of glass 65. The preferred glass is a commercially available quartz, most preferably 6 inches square having an initial thickness of about 0.25 inches. Other glass may be used, such as green soda-lime glass, low sodium white soda-lime glass, borosilicate glass, and aluminum oxide. In order to improve adhesion of the chrome 60, the glass 65 may be sputter etched prior to the chrome deposit. Although chromium 60 is preferred in this embodiment, emulsion and ion oxide may also be used.

Figure 8:
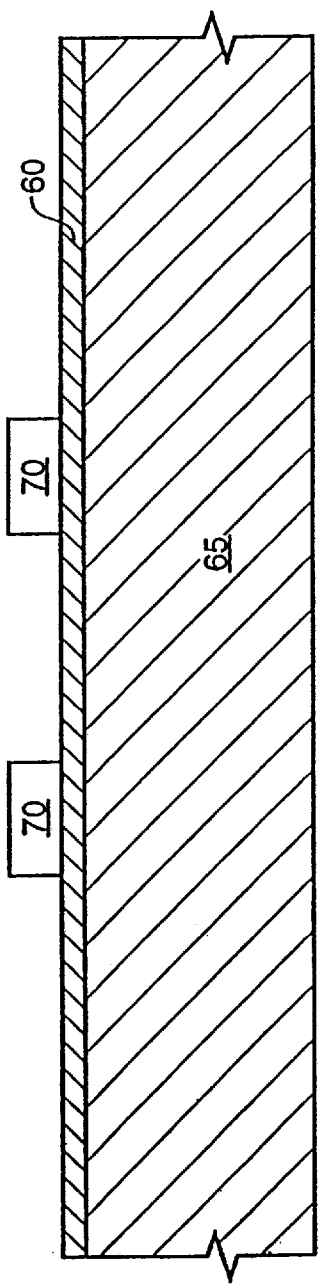

In FIG. 8, resist 70 is deposited on the chrome 60, preferably soft-baked and patterned to define chrome regions 15. In order to reduce reflectivity of the chrome, a thin anti-reflective coating, such as approximately 200 angstrom of $Cr_2O_3$, may be formed overlying the chrome 60 prior to the resist 70 deposit. The resist 70 is developed, and removed with de-ionized, DI water. Preferably the remaining resist is hard baked.

Figure 9:
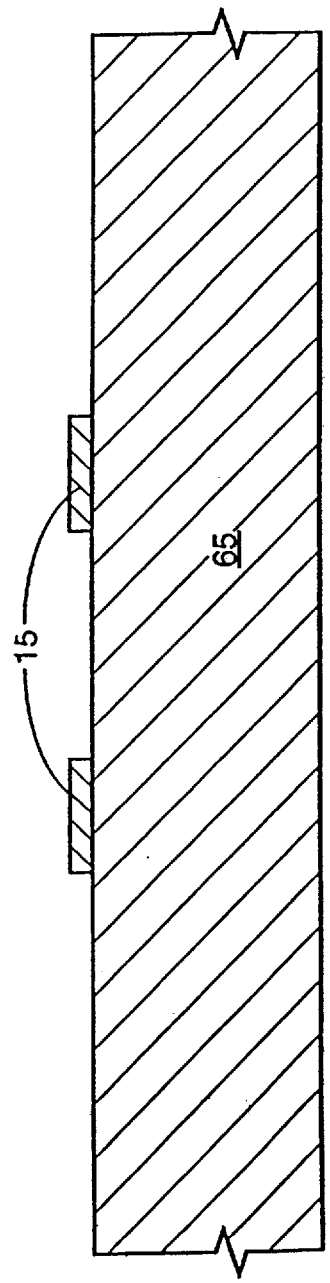

In FIG. 9 the exposed chrome is removed using either a plasma etch, such as $Cl_2/O_2$, or a wet etch using cerric ammonium nitride. These remaining chrome regions are now numbered 15 to coincide with the numbers in FIG. 4.

Figure 10:
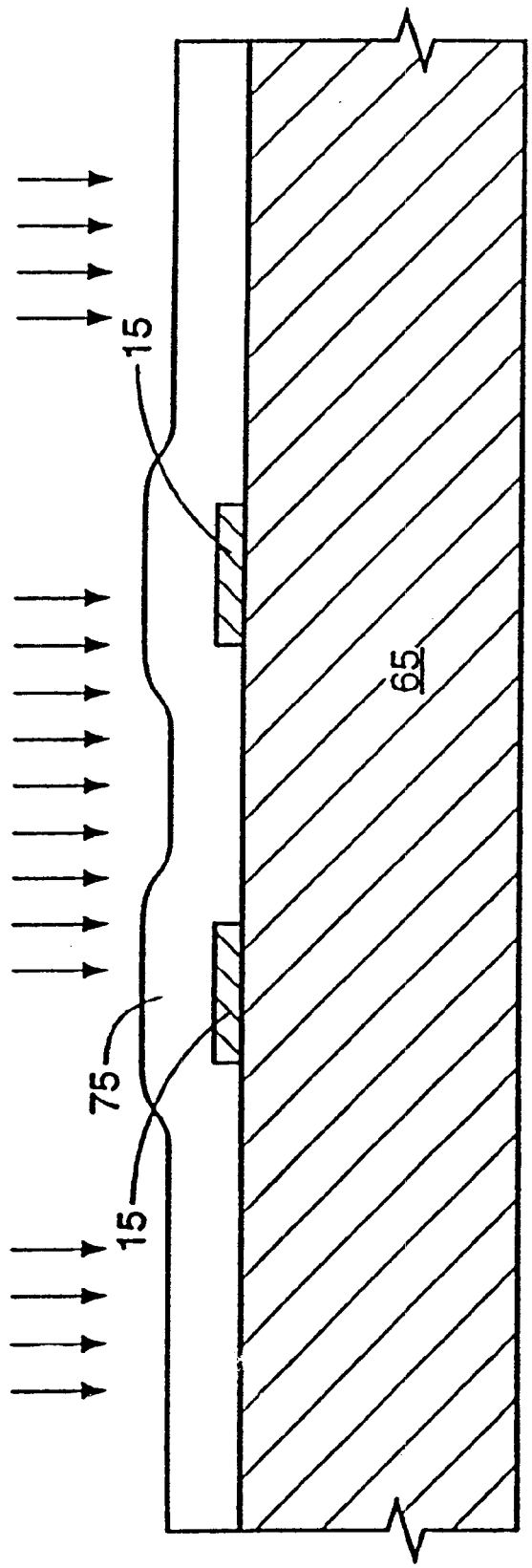

In FIGS. 10 and 11, a second resist layer 75 is deposited and then patterned to define future steps in glass 65. The resist 75 is removed in exposed areas using a process similar to the one described with respect to resist layer 70.

In FIG. 12 the glass substrate is quartz and the wave length of the UV light is 365 nm. The quartz is etched to a depth of 850 Angstrom in exposed regions to create planar surfaces 10 recessed from planar surface 5 and to create steps 20. Thus, optical pattern transfer tool 1 is fabricated to have both transparent steps 20 and opaque regions 15. The depth of the etch is selected to obtain an approximately 180 degree phase shift according to the formula $d=\lambda/2(n-1)$.

It can be seen that portions of the steps 20 are self-aligned to a sidewall of chrome region 15. The region of the glass 10 formed between two of these self-aligned portions defines an area for contact plug formation on the semiconductor wafer. The chrome sidewalls are exposed during patterning of the steps. This self-alignment allows the designer to control the width of glass region 10 between two chrome regions 15 to be within critical dimension specifications, since the chrome regions 15 can be accurately positioned on the glass 65.

At this point, the fabrication of the optical pattern transfer tool is complete although a protective barrier may be applied to minimize contamination effects. One such protective barrier is a pellicle. Pellicles are well known in the art.

Figure 13A:
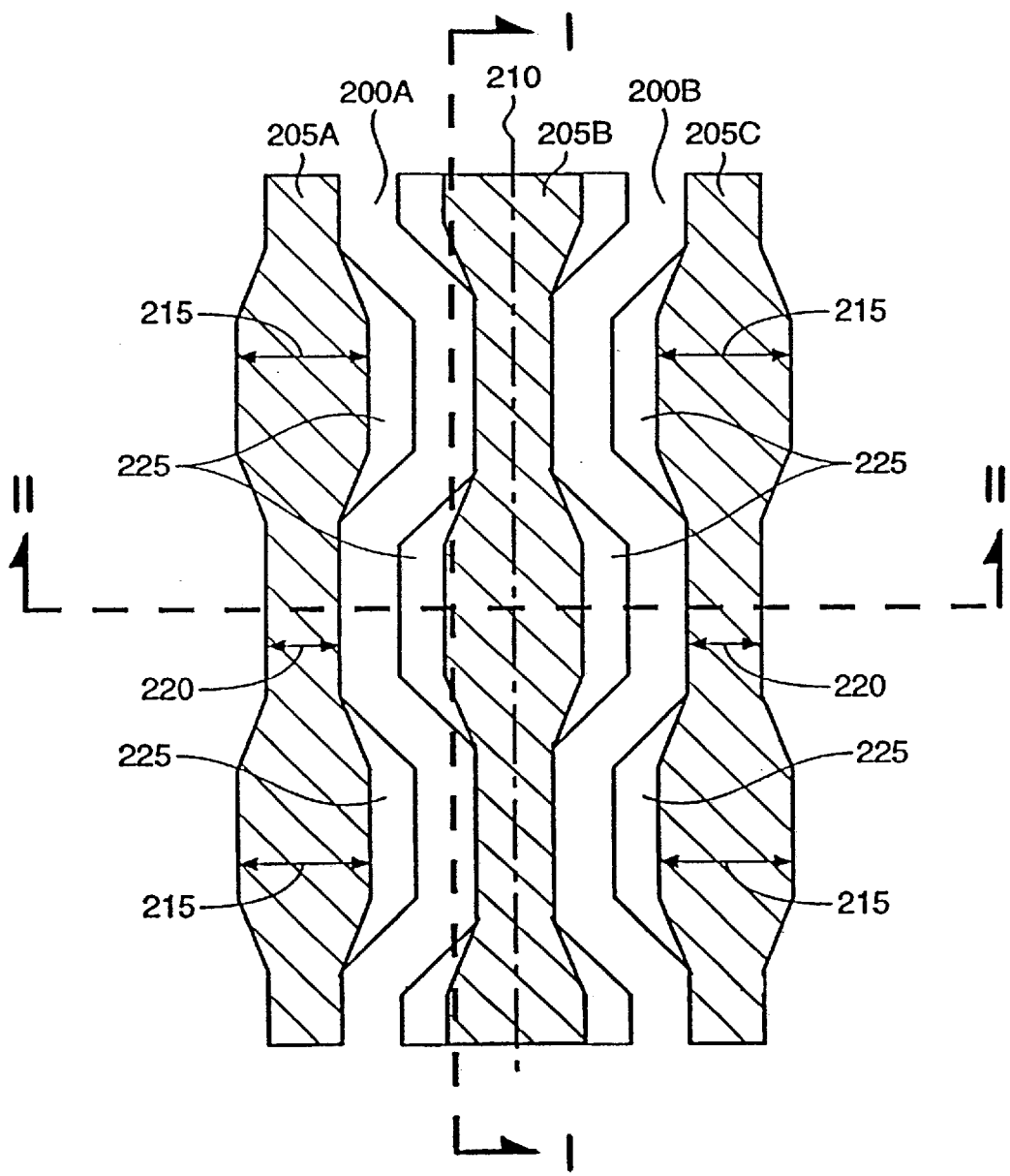
FIG. 13A is a top planar view of a portion of the optical pattern transfer tool shown in FIG. 4A.
Figure 13B:
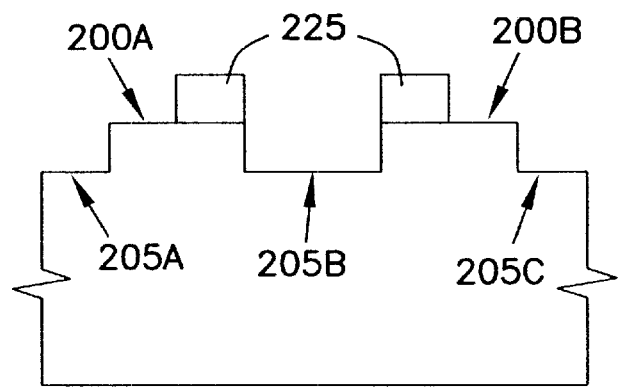
FIG. 13B is a cross section of the optical pattern transfer tool of FIG. 13A taken at the R axis.
Figure 13C:
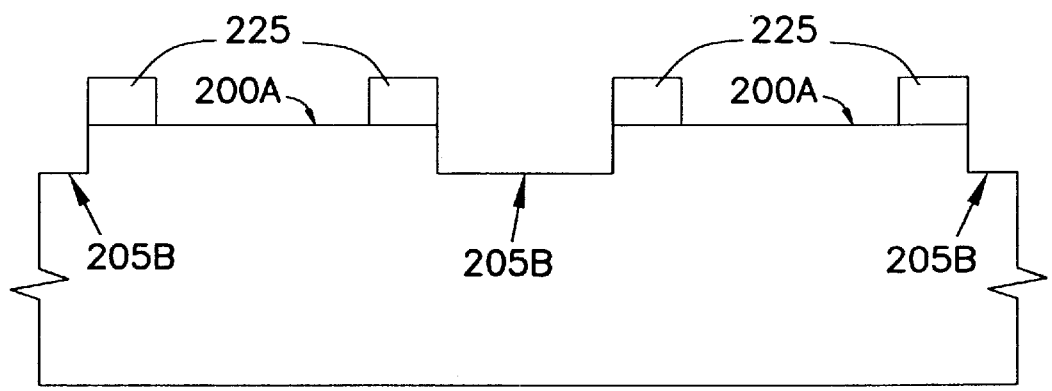
FIG. 13C is a cross section of the optical pattern transfer tool of FIG. 13A taken at the S axis.

A portion of FIGS. 4A–C have been redrawn in FIGS. 13A–C to provide an alternate description of optical pattern transfer tool 1. Optical pattern transfer tool 1 is comprised of a transparent material having two thicknesses. Regions 200A–B have a first thickness and regions 205A–C have a second thickness less than the first thickness. Each of regions 200A–B and 205A–C are symmetrical about an axis 210 running through region 205B. Each of regions 205A–C have a maximum width 215 and a minimum width 220. Opaque regions 225 overly the transparent regions 200A–B at points adjacent to one of regions 205A–C at a location having the maximum width 215.

Therefore, by using the method of the invention the shape of chrome patterns 15 on optical pattern transfer tool 1 are adjusted to get a desired shape on the wafer. For nonactive areas on a DRAM, the width d3 of a wordline is printed as small as 0.15 micrometers and the separation d4 between these wordlines in the nonactive areas is as small as 0.2 micrometers at 365 nanometer lithography. As a result of improving the process latitude of the wordline level in DRAMS, the size of the wordline over nonactive areas 50 is reduced so that a maximum area is given for active areas 40 for the bit contact and the container.

In the method of the invention described above, the polarity of the optical pattern transfer tool is positive which corresponds to transparent field areas. However, a negative optical pattern transfer tool, wherein the field areas are opaque, may be made in accordance with the present invention. Although one embodiment of the invention has been described as a method for patterning wordlines, the method of the invention may be used to pattern any structure having both small dimensions and critical dimensions. And although the invention has been described wherein ultra violet light is directed at the optical pattern transfer tool, the method described herein should not be limited to UV light but should encompass light of any wavelength and should encompass systems using other energy sources to pattern a semiconductor wafer.

What is claimed is:

1. A method for patterning a feature of a semiconductor integrated circuit, comprising:

providing a substrate;

forming a feature layer overlying the substrate;

forming a photoresist layer overlying the feature layer;

providing an optical pattern transfer tool;

placing an opaque material and a transparent material having first and second thicknesses over the substrate;

aligning a sidewall of the opaque material with a portion of a sidewall of the transparent material at a transition between the first and second thicknesses of the transparent material;

projecting light onto the optical pattern transfer tool;

substantially prohibiting the light from passing through the opaque material;

substantially prohibiting the light from passing through the transition of the first and second thicknesses of the transparent material; and transmitting light through the first and second thicknesses of the transparent material onto portions of the photoresist layer for patterning the feature.

2. The method of claim 1, further comprising:

removing unexposed portions of the photoresist layer;

exposing portions of the feature layer; and removing the exposed portions of the feature layer wherein a number of remaining portions form the feature.

3. The method of claim 1, further comprising:

removing unexposed portions of the photoresist layer;

exposing portions of the feature layer; and removing the exposed portions of the feature layer wherein a number of remaining portions form the wordline.

4. A method for patterning a wordline of a semiconductor integrated circuit, comprising:

providing a substrate;

forming a feature layer overlying the substrate;

forming a photoresist layer overlying the feature layer;

providing an optical pattern transfer tool;

placing an opaque material and a transparent material having first and second thicknesses over the substrate;

aligning a sidewall of the opaque material with a portion of a sidewall of the transparent material at a transition between the first and second thicknesses of the transparent material;

projecting light onto the optical pattern transfer tool;

substantially prohibiting the light from passing through the opaque material;

substantially prohibiting the light from passing through the transition of the first and second thicknesses of the transparent material; and transmitting light through the first and second thicknesses of the transparent material onto portions of the photoresist layer for patterning the wordline.

5. A method for patterning a feature of a semiconductor integrated circuit, comprising:

providing a substrate;

forming a feature layer overlying the substrate;

forming a photoresist layer overlying the feature layer;

providing an optical pattern transfer tool;

placing an opaque material and a transparent material having first and second thicknesses over the substrate;

aligning a sidewall of the opaque material with a portion of a sidewall of the transparent material at a transition between the first and second thicknesses of the transparent material;

projecting light onto the optical pattern transfer tool;

substantially prohibiting the light from passing through the opaque material and the transition of the transparent material at the portion aligned with the sidewall of the opaque material;

patterning a width of the feature on the photoresist layer overlying a first area of the substrate;

substantially prohibiting the light from passing through the transition of the first and second thicknesses of the transparent material at positions unaligned with the sidewall of the opaque material;

patterning a width of the feature on the photoresist layer overlying a second area of the substrate; and transmitting light through the first and second thicknesses of the transparent material onto portions of the photoresist layer for patterning the feature.

6. The method of claim 5, further comprising:

removing the exposed portions of the photoresist layer;

retaining unexposed portions of the photoresist layer; and removing the exposed portions of the feature layer wherein a number of remaining portions form the feature.

7. A method for patterning a wordline of a semiconductor integrated circuit, comprising:

providing a substrate;

forming a feature layer overlying the substrate;

forming a photoresist layer overlying the feature layer;

providing an optical pattern transfer tool;

placing an opaque material and a transparent material having first and second thicknesses over the substrate;

aligning a sidewall of the opaque material with a portion of a sidewall of the transparent material at a transition between the first and second thicknesses of the transparent material;

projecting light onto the optical pattern transfer tool;

substantially prohibiting the light from passing through the opaque material and the transition of the transparent material at the portion aligned with the sidewall of the opaque material;

patterning a width of the wordline on the photoresist layer overlying a first area of the substrate;

substantially prohibiting the light from passing through the transition of the first and second thicknesses of the transparent material at positions unaligned with the sidewall of the opaque material;

patterning a width of the wordline on the photoresist layer overlying a second area of the substrate; and transmitting light through the first and second thicknesses of the transparent material onto portions of the photoresist layer for patterning the wordline.

8. The method of claim 7, further comprising:

removing the exposed portions of the photoresist layer;

retaining unexposed portions of the photoresist layer; and removing the exposed portions of the feature layer wherein a number of remaining portions form the wordline.

9. A method for forming a wordline of a semiconductor integrated circuit, comprising:

providing a substrate;

forming a conductive layer overlying the substrate;

forming a photoresist layer overlying the conductive layer;

providing an optical pattern transfer tool;

placing an opaque material and a transparent material having first and second thicknesses over the substrate;

aligning a sidewall of the opaque material with a portion of a sidewall of the transparent material at a transition between the first and second thicknesses of the transparent material;

projecting light onto the optical pattern transfer tool;

substantially prohibiting the light from passing through the opaque material and the transition of the transparent material at the portion aligned with the sidewall of the opaque material;

patterning a width of the wordline on the photoresist layer overlying a first area of the substrate;

substantially prohibiting the light from passing through the transition of the first and second thicknesses of the transparent material;

transmitting light through the first and second thicknesses of the transparent material without the transition to expose portions of the photoresist;

removing unexposed portions of the photoresist to expose portions of the conductive layer; and removing the exposed portions of the conductive layer wherein a number of remaining portions form the wordline.

10. A method for patterning a feature of a semiconductor integrated circuit, comprising:

providing a substrate;

forming a feature layer overlying the substrate;

forming a photoresist layer overlying the feature layer;

providing an optical pattern transfer tool comprising;

placing a chromium containing material and a quartz containing material having first and second thicknesses over the substrate;

aligning a sidewall of the chromium containing material with a portion of a sidewall of the quartz containing material at a transition between the first and second thicknesses of the quartz containing material;

projecting light onto the optical pattern transfer tool;

substantially prohibiting the light from passing through the chromium containing material;

substantially prohibiting the light from passing through the transition of the first and second thicknesses of the quartz containing material;

transmitting light through the first and second thicknesses of the quartz containing material onto portions of the photoresist layer for patterning the feature; and removing the optical pattern transfer tool from over the substrate.

11. The method of claim 10, further comprising:

removing unexposed portions of the photoresist layer;

exposing portions of the feature layer; and removing the exposed portions of the feature layer wherein a number of remaining portions form the feature.

12. The method of claim 10, further comprising:

removing the exposed portions of the photoresist layer;

retaining unexposed portions of the photoresist layer; and removing the exposed portions of the feature layer wherein a number of remaining portions form the feature.

13. A method for patterning a wordline of a semiconductor integrated circuit, comprising:

providing a substrate;

forming a feature layer overlying the substrate;

forming a photoresist layer overlying the feature layer;

providing an optical pattern transfer tool comprising;

placing a chromium containing material and a quartz containing material having first and second thicknesses over the substrate;

aligning a sidewall of the chromium containing material with a portion of a sidewall of the quartz containing material at a transition between the first and second thicknesses of the quartz containing material;

projecting light onto the optical pattern transfer tool;

substantially prohibiting the light from passing through the chromium containing material;

substantially prohibiting the light from passing through the transition of the first and second thicknesses of the quartz containing material;

transmitting light through the first and second thicknesses of the quartz containing material onto portions of the photoresist layer for patterning the wordline; and removing the optical pattern transfer tool from over the substrate.

14. The method of claim 13, further comprising:

removing unexposed portions of the photoresist layer;

exposing portions of the feature layer; and removing the exposed portions of the feature layer wherein a number of remaining portions form the feature.

15. The method of claim 13, further comprising:

removing the exposed portions of the photoresist layer;

retaining unexposed portions of the photoresist layer; and removing the exposed portions of the feature layer wherein a number of remaining portions form the feature.

16. A method for patterning a feature of a semiconductor integrated circuit, comprising:

provided a substrate;

forming a feature layer overlying the substrate;

forming a photoresist layer overlying the feature layer;

providing an optical pattern transfer tool comprising;

placing an opaque material and a transparent material having first and second thicknesses over the substrate;

aligning a sidewall of the opaque material with a portion of a sidewall of the transparent material at a transition between the first and second thicknesses of the transparent material;

projecting light onto the optical pattern transfer tool;

substantially prohibiting the light from passing through the opaque material and the transition of the transparent material at the portion aligned with the sidewall of the opaque material, wherein a width of the feature is patterned on the photoresist layer overlying an active area of the substrate;

substantially prohibiting the light from passing through the transition of the first and second thicknesses of the transparent material at positions unaligned with the sidewall of the opaque material, wherein a width of the feature is patterned on the photoresist layer overlying an inactive area of the substrate;

transmitting light through the first and second thicknesses of the transparent material onto portions of the photoresist layer for patterning the feature; and removing the optical pattern transfer tool from over the substrate.

17. The method of claim 16, wherein substantially prohibiting the light from passing though the opaque material comprises substantially prohibiting the light from passing through the opaque material and the transition of the transparent material at the portion aligned with the sidewall of the opaque material, wherein a width of the feature is patterned on the photoresist layer overlying a gate region of a transistor on the substrate.

18. The method of claim 16, wherein substantially prohibiting the light from passing through the transition of the first and second thicknesses of the transparent material comprises substantially prohibiting a 365 nm wavelength light from passing through the transition of the first and second thicknesses of the transparent material at positions unaligned with the sidewall of the opaque material, wherein a 0.15 micrometer width feature is patterned on the photoresist layer overlying an inactive area of the substrate.

19. A method for patterning a wordline of a semiconductor integrated circuit, comprising:

providing a substrate;

forming a feature layer overlying the substrate;

forming a photoresist layer overlying the feature layer;

providing an optical pattern transfer tool comprising;

placing an opaque material and a transparent material having first and second thicknesses over the substrate;

aligning a sidewall of the opaque material with a portion of a sidewall of the transparent material at a transition between the first and second -thicknesses of the transparent material;

projecting light onto the optical pattern transfer tool;

substantially prohibiting the light from passing through the opaque material and the transition of the transparent material at the portion aligned with the sidewall of the opaque material, wherein a width of the wordline is patterned on the photoresist layer overlying an active area of the substrate;

substantially prohibiting the light from passing through the transition of the first and second thicknesses of the transparent material at positions unaligned with the sidewall of the opaque material, wherein a width of the wordline is patterned on the photoresist layer overlying an inactive area of the substrate;

transmitting light through the first and second thicknesses of the transparent material onto portions of the photoresist layer for patterning the wordline; and removing the optical pattern transfer tool from over the substrate.

20. The method of claim 19, wherein substantially prohibiting the light from passing through the opaque material comprises substantially prohibiting the light from passing through the opaque material and the transition of the transparent material at the portion aligned with the sidewall of the opaque material, wherein a width of the wordline is patterned on the photoresist layer overlying a gate region of a transistor on the substrate.

21. The method of claim 19, wherein substantially prohibiting the light from passing through the transition of the first and second thicknesses of the transparent material comprises substantially prohibiting a 365 nm wavelength light from passing through the transition of the first and second thicknesses of the transparent material at positions unaligned with the sidewall of the opaque material, wherein a 0.15 micrometer width wordline is patterned on the photoresist layer overlying an inactive area of the substrate.

* * * * *